(12) United States Patent
Wieland et al.

(10) Patent No.: US 6,844,560 B2
(45) Date of Patent: Jan. 18, 2005

(54) LITHOGRAPHY SYSTEM COMPRISING A CONVERTER PLATE AND MEANS FOR PROTECTING THE CONVERTER PLATE

(75) Inventors: Marco Wieland, Delft (NL); Bert Jan Kampherbeek, Delft (NL); Pieter Kruit, Delft (NL)

(73) Assignee: Mapper Lithography IP B.V., Delft (NL)

( * ) Notice: Subject to any disclaimer, the term of this patent is extended or adjusted under 35 U.S.C. 154(b) by 96 days.

(21) Appl. No.: 10/218,223

(22) Filed: Aug. 13, 2002

(65) Prior Publication Data

US 2003/0030014 A1 Feb. 13, 2003

Related U.S. Application Data

(60) Provisional application No. 60/312,169, filed on Aug. 13, 2001.

(51) Int. Cl.[7] ................................................ H01J 37/00
(52) U.S. Cl. ............................ 250/492.24; 250/492.2
(58) Field of Search ........................ 250/492.24, 492.2, 250/505.1

(56) References Cited

U.S. PATENT DOCUMENTS

| 4,695,732 A | 9/1987 | Ward |
| 4,902,930 A | 2/1990 | Van Der Mast |
| 6,538,256 B1 * | 3/2003 | Mankos et al. ........ 250/492.24 |

FOREIGN PATENT DOCUMENTS

| EP | 0334334 | 9/1989 |
| EP | 0605964 | 7/1994 |

* cited by examiner

*Primary Examiner*—Kiet T. Nguyen
(74) *Attorney, Agent, or Firm*—Blakely, Sokoloff, Taylor & Zafman

(57) ABSTRACT

A lithography system comprising a converter element (7) for receiving light and converting said light in a plurality of electron beams (15) to be directed towards and focused on a substrate (10) to be processed, said plurality of electron beams (15) being used to define a pattern in a resist layer (20) on said substrate (10), wherein said lithography system is provided with a protective foil with holes at the positions of the electron beams (23) being arranged to protect, in use, said converter element (7) from contamination with material from the resist layer (21).

28 Claims, 6 Drawing Sheets

LITHOGRAPHY SYSTEM COMPRISING A CONVERTER PLATE AND MEANS FOR PROTECTING THE CONVERTER PLATE

The present patent application is a non-provisional application claiming the priority of provisional application No. 60/312,169 filed Aug. 13, 2001.

FIELD OF THE INVENTION

The invention relates to a lithography system comprising a converter element for receiving light and converting said light in a plurality of electron beams to be directed towards and focused on a substrate to be processed. The invention further relates to a method for preventing contamination of a source of charged particles in a lithography system with material from a resist layer present on a substrate to be processed. The invention further relates to a substrate processed using the lithography system described.

PRIOR ART

A lithography system using a converter element designed to convert a light beam into beams of charged particles is known per se from WO98/54620, which text is incorporated herein as if fully set forth. The purpose of the use of the converter element is to provide a better resolution (0.1 µm or less) than was possible with prior art systems without such converters in which the resolution was entirely determined by the wavelength of the light beam used. Furthermore, such a lithography system makes it possible to obtain a high productivity. The converter element, preferably being a semiconductor field-emission photo cathode array, releases a plurality of electron beams. The electron beams are released from the tips of semiconductor needles. The electron beams are thus released from relatively small areas. In practice, the area of a tip only takes up less than 0.1% of the total area of the converter element.

Despite the fact that the converter element in such a lithography system is sturdy and not prone to damage, contamination was found to reduce the quality of the sources, and inherently, to limit the minimal feature size to be written on the substrate. Contamination occurs due to the interaction of electrons from the source with the resist layer that is needed for pattern definition on the substrate's surface. The resist layer, for instance being a polymer, degrades by the energy release from the impinging electrons. The polymer molecules crack and parts of them may be expelled from the surface of the resist layer. By traversing the vacuum, the molecules may reach the surface of the field emitter array and adsorb there, causing a reduction of the quality of the emitters. Also, if other resists are used, material originating from the surface may become freed and reach the surface of the converter element, causing reduction of the quality. Furthermore, also other contaminations present in the system affect the converter surface and its performance.

Since the precision of lithography systems moves towards a sub 0.1 Micron resolution, contamination of charged particle sources becomes more important.

U.S. Pat. No. 4,902,930 describes an arrangement of an extremely thin protective foil in an electron image projector. The foil is used as a vacuum seal halfway between the electron source and the substrate to prevent gas, liberated from the target by the impinging electron beam, from reaching the electron source. The foil is permeable for electrons though. However, in a lithography system of the sub 0.1 micron generation, this system will not work. Electrons will scatter when passing the foil. Even when the scattering angle is very small, sub 0.1 micron resolution cannot be reached anymore. Another problem with this known solution for a contamination problem is the fact that the foil needs to be extremely thin, i.e. <0.1 micron. In high electric fields, as used in lithography systems as described in WO98/54620, the electrostatic force will deform the foil. As a result the presently required sub-0.1 micron resolution cannot be obtained.

SUMMARY OF THE INVENTION

It is an object of the present invention to provide a method and an arrangement for a lithography system to accomplish the definition of feature sizes, smaller than the diffraction limited wavelength of the light source used by improving the reliability of the surface quality of the electron sources in the field emitter array.

The present invention relates to a lithography system comprising a converter element for receiving light and converting said light in a plurality of electron beams to be directed towards and focused on a substrate to be processed, said plurality of electron beams being used to define a pattern in a resist layer on said substrate, wherein said lithography system is provided with a protective thin foil located between said converter element and said substrate and having holes at the positions of the electron beams and being arranged to protect, in use, said converter element from contamination with material from the resist layer.

The present invention further relates to a method for transferring a pattern onto a resist on a substrate, using a lithography system comprising a converter element for receiving light and converting said light in a plurality of electron beams to be directed towards and focused on a substrate to be processed, said plurality of electron beams being used to define a pattern in a resist layer on said substrate, the method comprising the step of applying a metal film on said resist to protect, during transfer of said pattern, said converter element from contamination with material from the resist layer, said metal film being applied in an electron-transparent thickness.

In an embodiment, said thin foil, comprises at least one conductive surface. In such an embodiment it is possible to combine two possible functions of the foil. First, the foil prevents material from the resist layer from reaching the converter element, and furthermore it may provide a well-defined plane of equal electric potential. Also, the conductive surface may prevent local charging of the foil. In a further embodiment, the thin foil is a thin metal foil. This metal foil can have a thickness of 1–200 micron. The thin metal foil may consists of gold, copper or molybdenum. In another embodiment, the thin foil comprises a semiconductor layer, like silicon. The semiconductor layer can in turn be provided with a thin conducting film. e.g. a metal film. This film can either be a continuous layer, for instance having a thickness of between about 0.3–30 nm, or may have holes at the locations of the electron beams, or may have a thickness of between about 0.3–30 nm at the locations of the electron beams.

The holes in the foil provide locations, which are more transparent to the electron beams. In one embodiment, the holes are through holes or perforations.

The preferred location of the holes is at the position of the electron beam sources. Especially when a foil of a larger thickness is used, said hole locations do not cause too much energy loss. In an embodiment, the holes are though holes or perforations through the entire foil. If such a foil provided with holes is used, it was found that the beams should be kept within the inner 5–15%, specifically about 10% of the hole. Considering the divergence of the beam in practice, this leads to a relation between the size of the holes and the thickness of the foil. When, for instance, the divergence of a beam is 30 mrad and the holes are 1 micron in diameter, this would lead to a maximum thickness of about 34 microns. An additional advantage of the foil provided with holes is that it offers the possibility to reduce electro-optical aberrations, specifically spherical aberrations. Furthermore, it makes it possible to choose a foil of greater thickness. In order for the lithography system to have a resolution better than 0.1 micron, the conductive layer of the foil should be very flat: better than 20 nanometers. This also means that the foil has to be rigid, or well clamped in the lithography system in order to cope with the electrostatic forces, which can influence the shape of the foil.

In order to prevent deformation, the foil can be provided with support bars. These bars can either be attached to the foil or be formed intergrally with the foil. Especially when for instance silicon is used for the foil, it is well possible to produce a foil which is provided with support bars. These bars in one embodiment run across the foil, between the holes. The bars can be provided on either side of the foil, or on both sides. The foil, for instance silicon, can furthermore be provided with a conductive layer. For instance a metal layer can be applied. The metal layer can either be applied on the surface of the foil. As the metal layer preferably is as flat as possible, this would as for support bars on only one side of the foil.

The metal layer can be applied as a continuous layer all over the foil. The metal layer should, however, interfere as little as possible with the electron beams. In practice, this would require the layer to be as thin as 0,3–30 nm at the locations of the electron beams. An alternative would be to apply the metal layer only on the surface on the parts of the foil where there are no electron beams, or to thin the layer up to the required thickness at the locations of the electron beams.

In another embodiment of the lithography system of the invention, the protective foil is supported by the converter element. In an embodiment thereof, the converter element is a field-emission photo cathode array having spacers between its tips. In a further embodiment thereof the spacers are located between the tips or needles of said photo cathode array, the spacers being at least as high as the needles and being made of substantially non-conductive material, and support the foil. In even a further embodiment thereof, the area of the ends of the spacers is larger than the area of the basis of the spacers. In general, the field-emission photo cathode will be a semiconductor photo cathode. In a further embodiment thereof, the spacers at their end are provided with a conductive layer, the conductive layers of the spacers being electrical conductively interconnected. In this way, it is possible to define a plane of constant potential. This can also reduce electro-optical aberrations like spherical aberrations. In one embodiment, the spacers hold a continuous conductive layer having openings at the positions of the tips of the needles. The continuous layer may be provided at a level above the tips of the needles. In another embodiment the conducting surface comprises a grid of electrodes. An advantage of the latter embodiment would be that every electron beam could be adjusted separately.

In an embodiment of the lithography system, wherein the protective foil is supported by the converter element, the converter element being a semiconductor gated field-emission photo cathode array.

In another embodiment of the invention, a metal film is deposited on top of the resist layer, said metal film being substantially transparent to said plurality of electron beams. Said metal film prevents resist material to leave the resist layer. Furthermore, it prevents a charge built up on said resist layer. Such a film may be deposited using known techniques. The thickness of said metal film is between 0.3 and 30 nm.

In an embodiment of the lithography system described, it is furthermore provided with means for providing a first electric potential V1 to said converter plate, a second electric potential V2 to said thin foil, and a third electric potential V3 to said substrate, wherein the electric field between the converter plate and the foil is substantially larger than the electric field between the foil and the substrate.

The invention further pertains to a lithography system comprising a source of charged particles and means for transferring a pattern onto a resist layer provided on a substrate using charged particles from said source of charged particles, wherein a metal film is provided on the surface of the resist layer in order to prevent material from the resist layer reaching said source of charged particles, said metal film having a for said charged particles transparent thickness.

The invention further pertains to a lithography system comprising a source of charged particles and means for transferring a pattern onto a resist layer provided on a substrate using charged particles from said source of charged particles, wherein said lithography system is provided with a protective foil between said source of charged particles and said resist layer for preventing material from said resist layer from reaching said source of charged particles, wherein said lithography system is furthermore provided with transportation means to replace a first surface of said protective means by a second, fresh surface of said protective means.

The invention further pertains to a method for transferring a pattern onto a resist layer provided on a substrate in a lithographic process, wherein a metal film is provided on top of the resist layer before the pattern is transferred onto the resist layer. The metal film, in a very simple way, prevents material from the resist layer from influencing the process of the transferral of the pattern onto the resist layer. The thickness of the metal film should be such that the film is transparent for the electrons.

The invention further pertains to a substrate, processed by any of the described embodiments.

The lithography system may be provided with transportation means to replace a first surface of said protective foil, by a second, fresh surface of said protective foil. In this way it is avoided that energy loss or other disadvantages effects occur. In one embodiment thereof, said transportation means of said protective foil further comprises a first coil winder and a second coil, winder, and the thin foil is arranged to be transported from said first coil winder to said second coil winder to replace said first surface of said thin foil by said second, fresh surface of said thin foil.

In another embodiment with transportation means, said transportation means of said protective foil comprise a stage, said thin foil being clamped on said stage, said stage being arranged for displacements to replace said first surface of said thin foil by said second, fresh surface of said thin foil. In an embodiment, said stage comprises piezoelectric actuators.

In the embodiments with transportation means, said thin foil is continuously transported at a predetermined rate in order to prevent said material attached to the present surface of the foil from influencing the performance of the lithography system.

Several of the described embodiments may also be combined, thus making it possible to fulfill all the requirements to obtain a lithography system which can produce a pattern having details smaller than 0.1 micron on a substrate.

BRIEF DESCRIPTION OF THE DRAWINGS

The invention will now be explained with reference to some drawings which are only intended to illustrate the invention and not to limit its scope of protection.

DESCRIPTION OF PREFERRED EMBODIMENTS

First of all a description of such a system as described in WO98/54620 is given. To that end, reference is made to FIG. 1.

The background of the system described in WO98/54620 is as follows.

Imagine that there is provided a known deep-UV lithography tool (i.e., wavelength 193 nm or less) for the 0.13 $\mu$m generation with a "traditional" 4×mask for obtaining the 0.1 $\mu$m generation. Then, at a substrate surface, each 0.4 $\mu$m "pixel" of a mask is focused to a spot of 0.13 $\mu$m. Since the distance between pixels at the substrate must be 0.1 $\mu$m, there is a mixing of information between neighboring pixels because the spots of 0.13 $\mu$m overlap each other. If we could sharpen up this 0.13 $\mu$m spot, this machine would be ready for the 0.1 generation. The sharpening up, or enhancement of resolution, cannot be done after the mixing of information has occurred.

According to one embodiment described in WO98/54620 only one pixel of the mask is illuminated. Then there is only an isolated spot of 0.13 $\mu$m at an imaginary substrate plane. At the location of the spot in the imaginary substrate plane a converter element, for example in the form of a photocathode of size 0.1 $\mu$m, or a photocathode with a metallic aperture of diameter of 0.1 $\mu$m on top, is positioned. Such a photocathode provides an electron source that may have a diameter of 0.1 $\mu$m or smaller. The photocathode that is obtained in this way is imaged with magnification factor 1 onto the substrate in a real substrate plane spaced from the photocathode. This can be done either with acceleration inside a magnetic field or with a small accelerating electrostatic lens. The next step is to move the mask, e.g., 0.4 $\mu$m in order to illuminate an adjacent pixel on the mask while, at the same time, movable the substrate 0.4/4=0.1 $\mu$m in order to have the adjacent pixel on the substrate written. In such a way, the mask pattern is transferred to the substrate with the required resolution.

However, it would take a long time to write patterns on a whole substrate with this single beam. The principle of pattern definition is the same when many pixels are written simultaneously. Therefore, a multiple beamlet embodiment can also be used. In theory, the distance between separate beams at the substrate surface needs only to be as much as the point spread function. In practice, certainly when electrostatic focusing is used, the fabrication technology of the photocathode/lens array will determine the minimum distance. The number of beams is estimated to be in the order of $10^6$–$10^8$.

Figure 1:
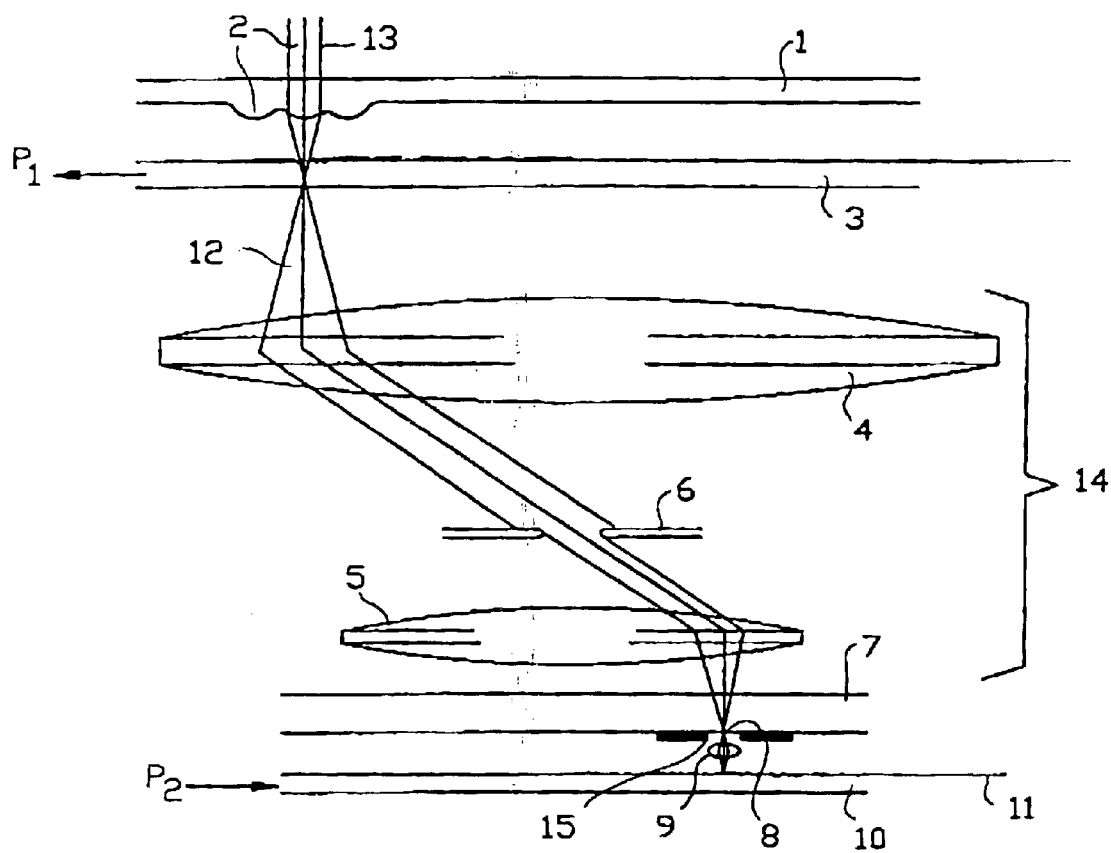
FIG. 1 shows schematically a lithography system according to the prior art in which the field emitter photo cathode array can be used.

Such a multiple beamlet embodiment is shown in FIG. 1. A light source (not shown) produces a light beam 13, preferably in deep WV. The light beam 13 impinges on a micro lens array 1 having lenses 2. The light beam 13 is as it were divided in beamlets 12, of which only one is shown for the sake of clarity. However, in practice there may as much as $10^7$–$10^8$ beamlets 12. The lens 2 focuses the beamlet 12 on a mask 3 with spots of, e.g., 400 nm diameter. Each light beamlet 12 leaving the mask 3 passes a demagnifier 14, which is schematically indicated by lenses 4 and 5 and an aperture 6. However, other types of demagnifiers known from the prior art may be used instead. By the demagnifier 14 the beamlets 12 are focused on a converter plate 7 having converter elements 8 of which only one is indicated. If, as disclosed by WO98/54620, the converter plate 7 is constituted by a photocathode having a plurality of apertures a plurality of electron beamlets 15 (only 1 being shown in FIG. 1) is generated. The electron beamlet 15 originates from the aperture and passes through focusing means, indicated schematically by a lens 9. Finally, the electron beamlet 15 impinges on the substrate 10 in substrate plane 11.

Figure 2:
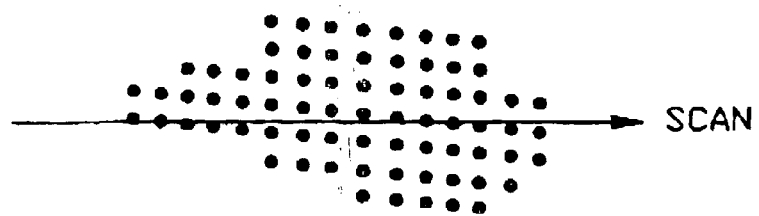
FIG. 2 shows an example of a scanning direction of pixels on a substrate to be lithographed.

The mask 3 may be moved in the direction of arrow PI and the substrate in the direction of arrow P2. If the mask 3 is, e.g., moved 0.4 $\mu$m the substrate must be shifted 0.1 $\mu$m. Pixels could be arranged at random on the substrate 10. In an embodiment shown in FIG. 2, the substrate pixels are arranged in lines and columns and the scanning direction SCAN differs from the direction of the lines of pixels.

The resolution is enhanced by sharpening up pixel by pixel, using a photocathode with very many apertures. This known technology is called "Multiple Aperture Pixel by Pixel Enhancement of Resolution" or "MAPPER" technology. It can be thought of as traditional projection lithography in which the mask information is split up and transferred to the substrate sequentially. It can also be thought of as multiple micro-column lithography in which the electron sources are blanked by the mask.

Figure 3:
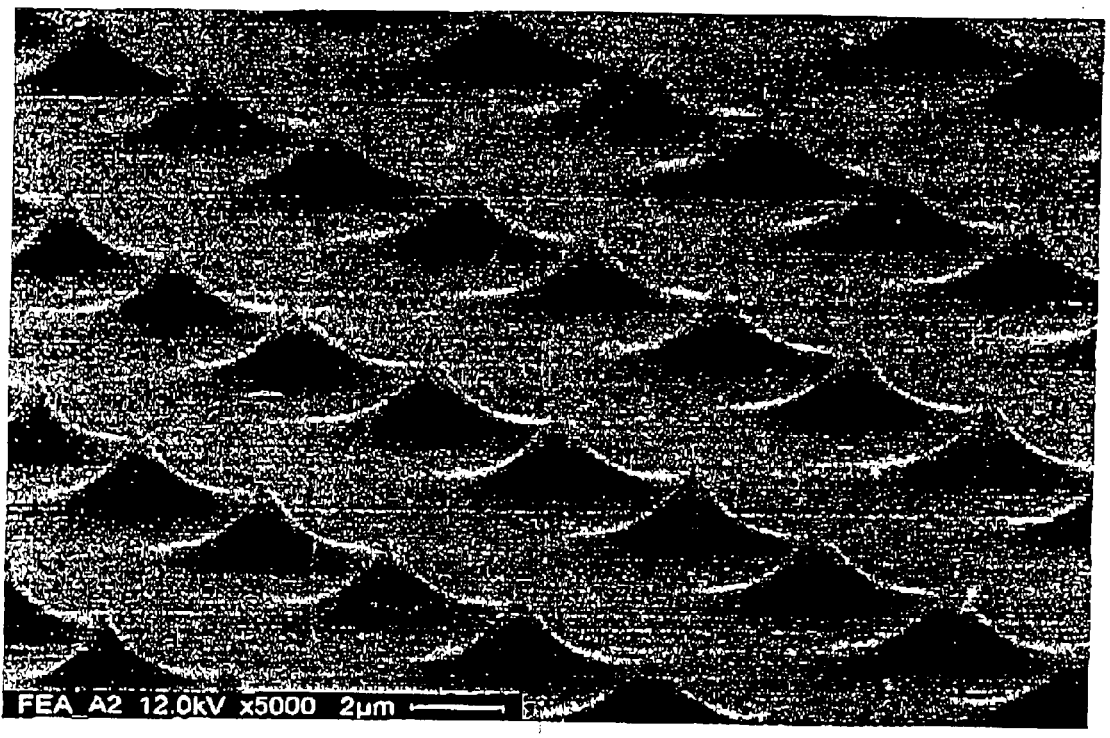
FIG. 3 shows a Scanning Electron Microscope (SEM) image of a p-type silicon substrate with an array of tips.

In accordance with PCT/NL00/00657, which text is incorporated herein by reference as if fully set forth, the converter plate 7 comprises a field emission array as shown in FIG. 3. FIG. 3 shows a plurality of tips on a p-doped silicon substrate. The image has been made by means of a Scanning Electron Microscope (SEM). The silicon substrate was sized 5 mm×5 mm. 81×81 tips were etched on the substrate surface. The tips shown were spaced about 8 $\mu$m whereas their height was about 4 $\mu$m. Of course, these figures are only examples. To further enhance the resolution on the substrate 10 to be processed, it is envisaged that the tips may be located closer to one another than 8 μm.

The front surface from the tips, from which the electrons leave the silicon, have a diameter of preferably less than 100 nm, even more preferably less than 50 nm.

FIG. 3 shows emitter tips with a conical shape. However, the invention is not limited to such a shape. The tips may have a rectangular shape or an other cross sectional shape, or a spherical shape.

A structure as shown in FIG. 3 has the following characteristics:

field emission is limited by the availability of electrons in the operating regime;

electrons are excited from the valence band in the conduction band by photons from the impinging beamlets 12;

tunnel probability approaches 1;

due to field penetration in the tips the sources are less sensitive for pollution than metallic emitters.

Figure 4:
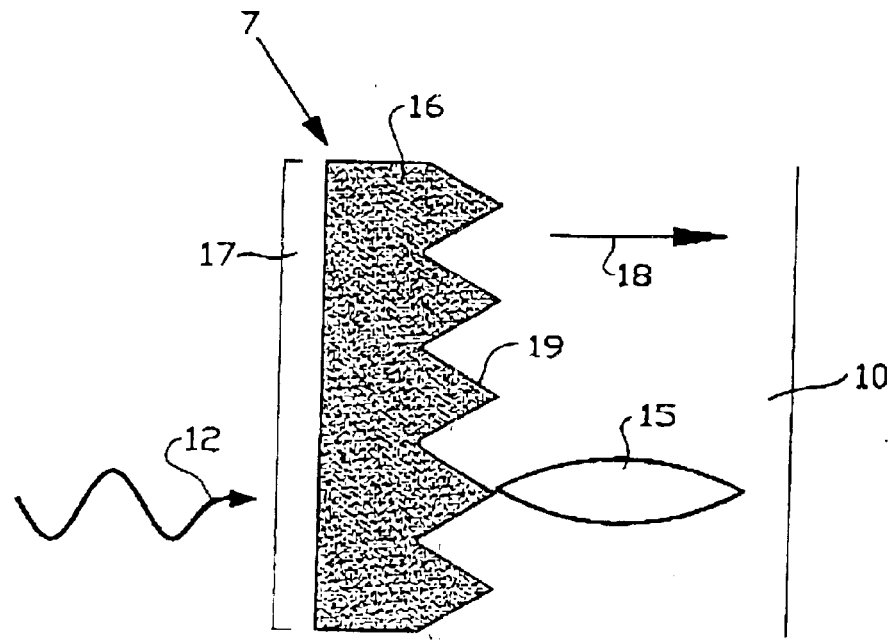
FIG. 4 shows schematically the operation of a semiconductor field emission array as shown in FIG. 3 in a MAPPER set-up.

FIG. 4 shows the operation of the semiconductor field emission array 7 in more detail. The array 7 comprises a supporting substrate 17, e.g., made of Pyrex, but any other suitable material can be used. The supporting substrate must be made from a material that has a very low absorption factor for the wavelength of the light beamlets 12. For instance, when UV light is used the material may be quartz. On top of the supporting substrate 17 a semiconductor point array layer 16 is provided, preferably made of p-doped silicon. However, by applying another semiconductor material the bandgap between the valence band and the conduction band may be tuned to the wavelength of the light beamlets 12 used.

The structure shown in FIG. 4 is used in the transmissive mode, i.e., light beamlet 12 impinges on the supporting substrate 17. The material used for the supporting substrate must be transparent to the wavelength of the light used. The photons from the light travel through the supporting substrate 17 and reach the semiconductor layer 16 where they will generate free electrons. The electrons 15 leave the silicon layer substantially at the front surface of the tips 19. An external (constant) electric and magnetic field 18 accelerate the emitted electrons towards the wafer 10 and focus them on the wafer 10 to be processed. The electrical and magnetic fields are preferably directed in parallel from the silicon layer 16 towards the substrate 10.

Figure 5:
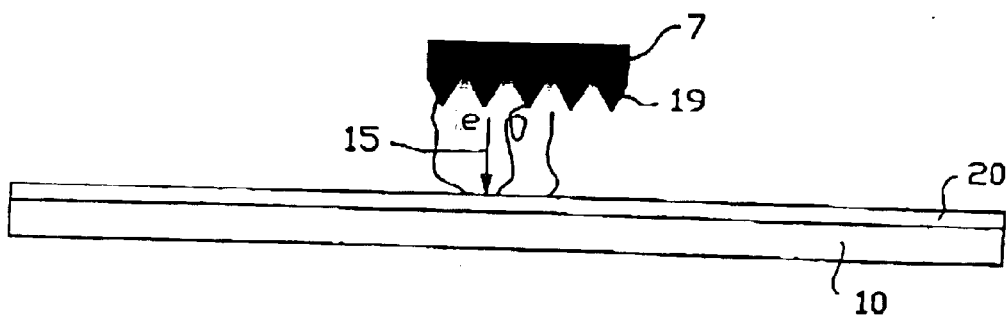
FIG. 5 shows schematically the contamination process of the field emitter sources.

FIG. 5 shows schematically a contamination process of the field emitter sources. The converter plate 7 is positioned above the substrate 10 to be processed. The substrate's surface is covered by a resist layer 20, which is used for pattern definition as known by persons skilled in the art. The electrons 35 emitted from the converter plate 7 are accelerated towards the substrate 10. Due to the interaction of the electrons 15, having relatively high energy due to the acceleration, and the resist layer, the resist layer 20 degrades. Molecules 21 are released, in case a polymeric resist is used, due to cracking. The molecules traverse the vacuum between the substrate and the converter plate 7, and are adsorbed at the surface of the plate 7. The presence of adsorbed molecules 21 or other contamination on the surface of the converter plate 7 changes the emission properties of the converter plate, which, in turn, affects its quality.

Figure 6:
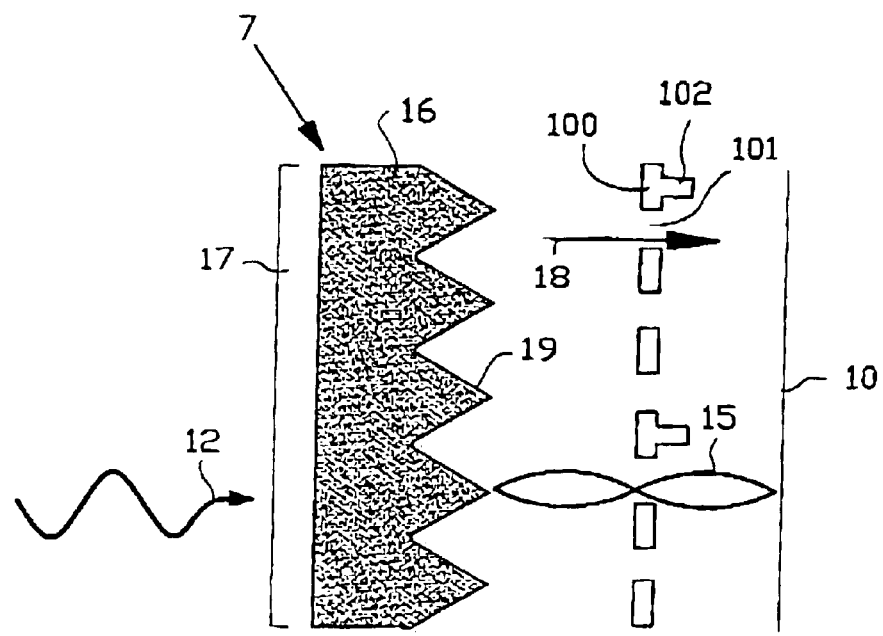
FIG. 6 shows the setup of FIG. 4 provided with a first type of thin foil.

FIG. 6 shows the layout already described in FIG. 4, in which between the converter element 16 and the wafer 10 a thin foil 100 is provided with holes 101 at the locations of the electron beams 15 according to the present invention. In this embodiment, the thin foil is provided with supporting bars 102 which extend between the holes. The bars are added in order to prevent deformation of the foil. The foil can be make of silicon.

Figure 7:
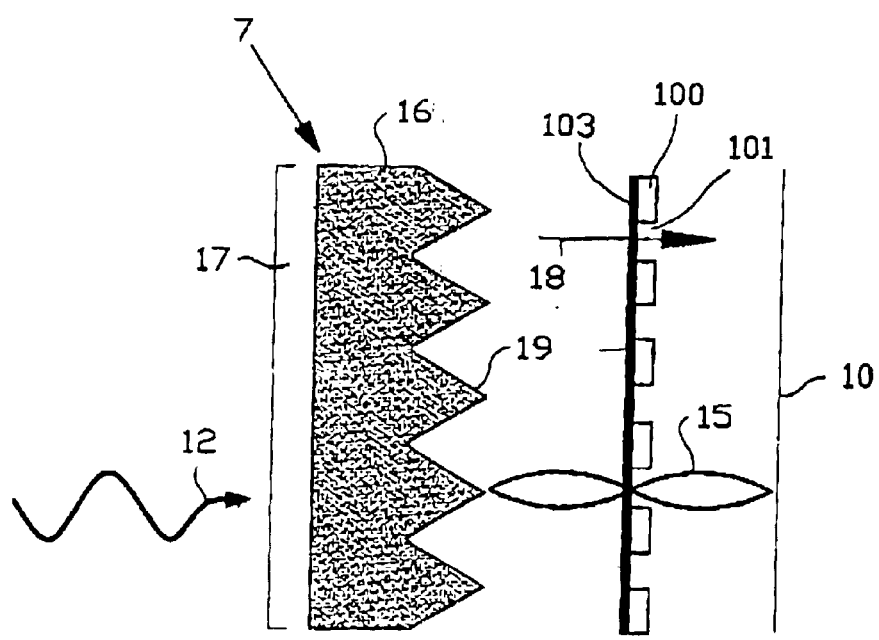
FIG. 7 shows the setup of FIG. 4 provided with a second type of thin foil.

In FIG. 7, the foil 100 is provided with a conductive film 103 on its surface. This film can either be very thin, e.g. 0.3–30 nm overall, or have holes at the positions of the electron beams. It may also be possible to use a film which has thinned parts at the locations of the electron beams. The electron beams should be influenced, e.g. scattered or distorted, as little as possible.

Figure 8:
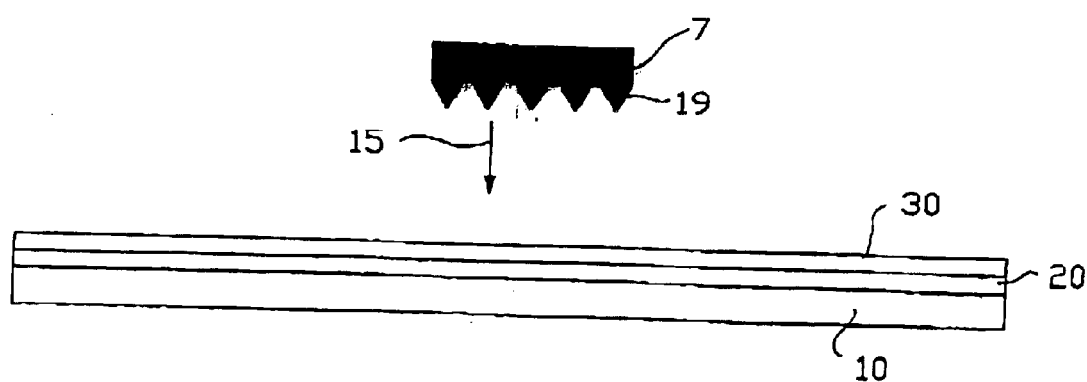
FIG. 8 shows a lithographic system comprising a substrate provided with a metal film on the resist layer.

FIG. 8 shows a substrate 10 provided with a resist layer 20, and on top of the resist layer a metal film 30. This metal film 30 may be deposited using vapor deposition of other means known in the art. In the figure, the substrate is placed in a lithography system using a converter plate. The substrate may also be used in other lithographic systems. The metal film may also provide a defined potential plane. The thickness of this film typically is about 0,3–30 nm.

Figure 9:
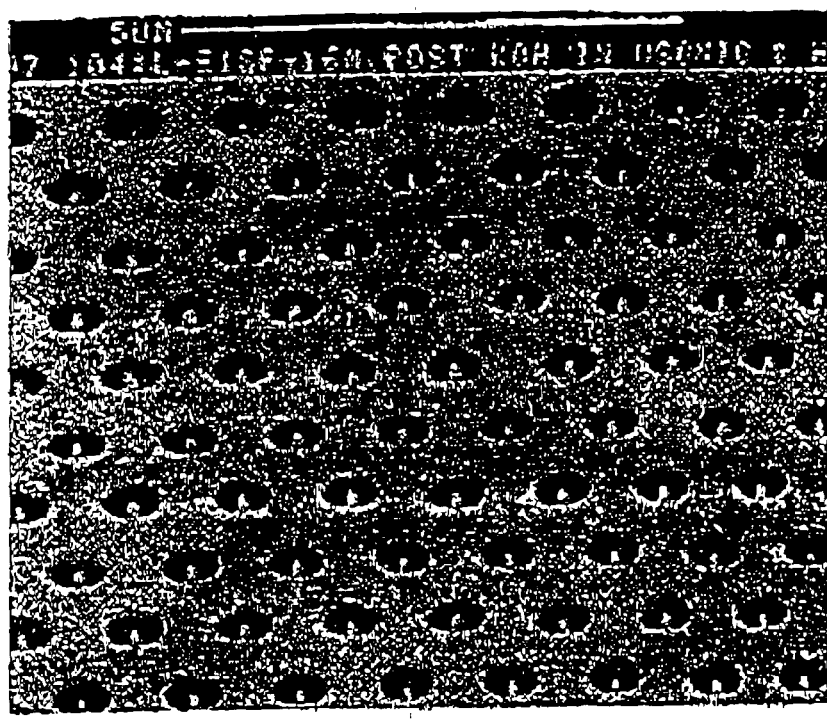
FIG. 9 shows a SEM image of a semiconductor gated field-emission photocathode array as converter element.
Figure 9:
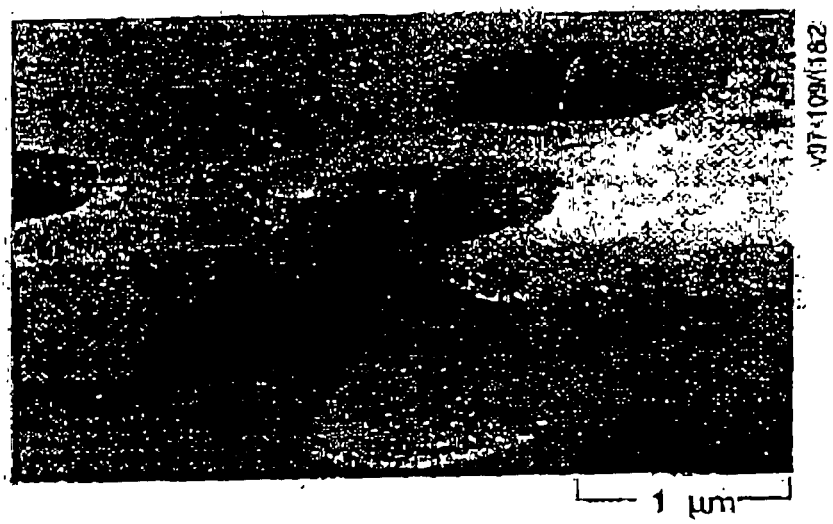

FIG. 9 shows a SEM image of a top view and crosscut of a semiconductor gated field-emission photocathode array. In such a photocathode array spacers are provided around the needles from which tips electrons are emitted. In one embodiment, The spacers are made of non-conductive or electrically insulating material, for instance silicon oxide. In the embodiment shown in the figure, the spacers fully surround the needles. In a further embodiment, the ends of the spacers are provided with a conductive layer, in a way to leave small openings around the tips of the needles. In this way the layer may provide a well defined plane of equal potential. In a further embodiment thereof, the spacers are higher than the needles. This provides the opportunity to manipulate the electron beams and improve the performance. In a further embodiment, the openings are as small as possible, preferably having a diameter smaller than 0.5 micron or even smaller than 0.1 micron, in order to reduce the spreading of the electron beams.

The spacers may be provided on the converter element after the needles are produced, or may be remainders of the etching process creating the needles.

Figure 10:
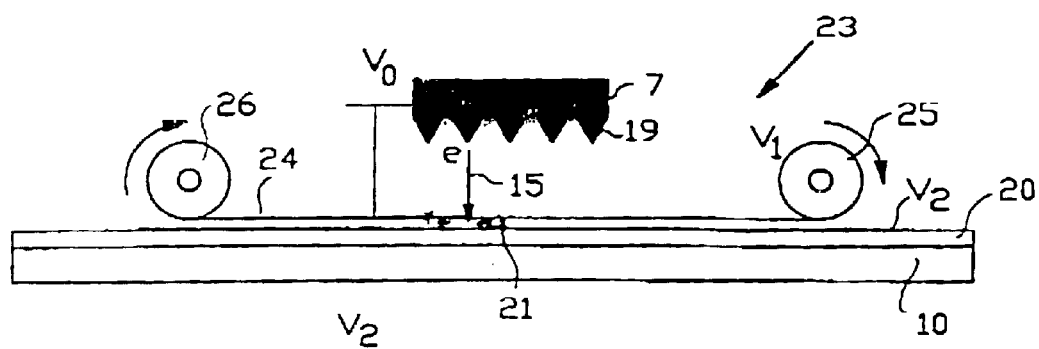
FIG. 10 shows schematically another means for protecting the converter element.

FIG. 10 shows schematically an alternative embodiment of protective means for protecting the converter element for preventing the contamination of the surface of the converter plate 7. The converter plate 7 is positioned above the substrate 10 to be processed. The substrate's surface is covered by a resist layer 20, which is used for pattern definition as known by persons skilled in the art. The electrons 15 emitted from the converter plate 7 are accelerated towards the substrate 10.

Between the converter plate 7 and the substrate 10 a movable foil device 23 is located. The movable foil device 23 comprises a movable foil 24, a first coil winder 25 and a second coil winder 26. The foil 24 is located closely above the substrate 10. The first and second coil winders 25, 26 are located at positions displaced relative to the converter plate 7 in the vertical direction in such a way that movements of parts of the multiple beam embodiment (FIG. 1) are not obstructed. They may be arranged to be driven by a motor (not shown) automatically or, alternatively, by hand. In this way the foil is transported.

The foil material has a typical thickness of 1–200 micron and is transparent for the energetic electrons 15. Such a foil may consist of e.g., gold, copper or molybdenum. At the same time, the foil prevents that cracked molecules 21 and/or other material released from the resist layer 20 and/or other contamination present in the system, from reaching the converter plate 7 and the emitter tips 19 by an earlier adsorption of the molecules on the foil 24.

The size of the foil surface is such that the area of the converter plate 7 as projected on the foil surface is smaller than the area of the foil surface. No line of sight exists between the surface of the resist layer 20, being exposed to the electron beamlets 12, and the converter plate 7. After a predetermined period of time, the foil 5 can be moved to refresh the portion of the foil 5 that has become contaminated by cracked molecules 21. Thus, a fresh portion of the foil 5 becomes available between the converter plate 7 and the substrate surface level.

The foil 24 may be located, substantially, at focal distance from the tips 19 of the converter plate 7. The electron beamlets 12, coming in at the surface of the foil 24, are thus focused on the foil as to prevent scattering at that point and defocusing at the substrate surface level.

Between the converter plate 7 and the foil area 24 a first accelerating potential V1 is maintained, and between the foil area 24 and the substrate surface (whatever layer being present) a second potential V2 is maintained. Preferably, the first potential V1 is much lower than V2 in order to obtain the best possible focusing of the beamlets on the foil. The second potential V2 has a higher level to reduce the kinetic energy of the electrons, and the energy transfer to the substrate 10 (i.e., to reduce heating). As an example, the accelerating potential V1 may be about −10 kV and the second potential V2 maybe about 0 V.

By transportation of foil 24 from the first coil winder 25 to the second coil winder 26 the foil surface between converter plate 7 and substrate 10 can be refreshed as desired. Also, some foil materials may be cleaned by an in-situ plasma of e.g., oxygen and reused a few times before transportation to refresh the foil.

Figure 11:
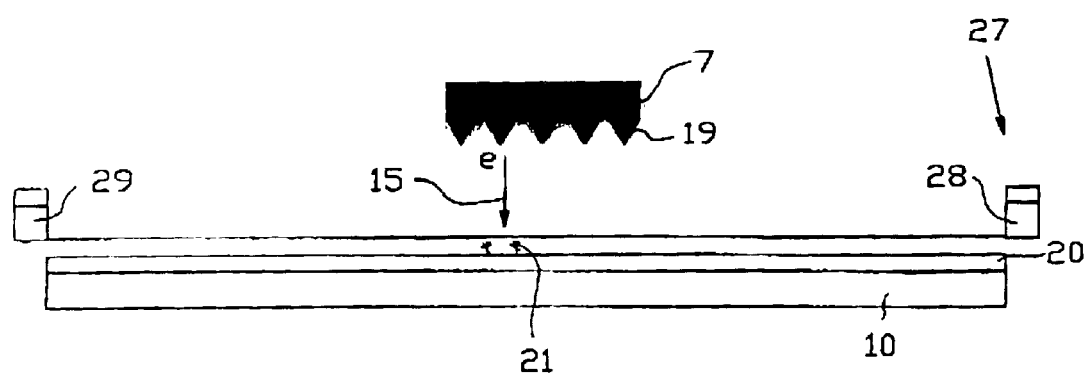
FIG. 11 shows schematically yet another means for protecting the converter element.

FIG. 11 shows schematically an alternative embodiment of FIG. 10. In this alternative embodiment, the movable foil device 23 uses a mechanism 27 for displacing the foil parallel to the substrate surface to refresh the foil above it. It is conceivable to use a substantially planar foil that may be shifted in one direction (or in two, preferably orthogonal directions) to provide a clean foil area 24 under the converter plate 7 as needed. The foil is clamped on a stage 27 which provides the necessary displacements to have a fresh foil area under the converter plate 7. The movement of the foil 24 by the stage 27 may be controlled in any suitable way known in the art, e.g., by piezoelectric actuators 28, 29.

It is to be understood that the above description is included to illustrate the operation of the preferred embodiments and is not meant to limit the scope of the invention. The scope of the invention is to be limited only by the following claims. From the above discussion, many variations will be apparent to one sided in the art that would yet be encompassed by the spirit and scope of the present invention.

What is claimed is:

1. A lithography system comprising a source of charged particles for providing a plurality of electron beams to be directed towards and focused on a substrate to be processed, said plurality of electron beams being used to define a pattern in a resist layer on said substrate, wherein said lithography system is provided with a protective thin foil located between said source of charged particles and said substrate, said protective thin foil having holes at the positions of the electron beams and being arranged to protect, in use, said source of charged particles from contamination with material from the resist layer.

2. The lithography system according to claim 1, wherein said protective thin foil comprises at least one conductive surface.

3. The lithography system according to claim 2, wherein said thin protective foil is a thin metal foil.

4. The lithography system according to claim 3, wherein said thin metal foil has a thickness of about 1–200 micron.

5. The lithography system according to claim 1, wherein said protective thin foil comprises supporting means.

6. The lithography system according to claim 5, wherein said supporting means comprise support bars attached to said protective thin foil.

7. The lithography system according to claim 5, wherein said supporting means comprise support bars formed integrally with said protective thin foil.

8. The lithography system according to claim 1, wherein said protective thin foil comprises a semiconductor layer having holes at the positions of the electron beams.

9. The lithography system according to claim 8, wherein said semiconductor layer comprises supporting bars formed integrally with said semiconductor layer.

10. The lithography system according to claim 8, wherein said protective thin foil comprises a thin conductive layer on the surface of said semiconductor layer.

11. The lithography system according to claim 10, wherein said conducting surface comprises a grid of electrodes.

12. The lithography system according to claim 8, wherein said protective thin foil comprises a continuous metal film on the surface of said semiconductor layer, said metal film having a thickness of about 0–30 nm at the positions of the electron beams.

13. The lithography system according to claim 1, wherein the source comprises a semiconductor field-emission photo cathode array comprising semiconductor tips.

14. The lithography system according to claim 1, wherein a second protective element is deposited on top of said resist layer on said substrate, said second protective element being substantially transparent to said plurality of electron beams.

15. The lithography system according to claim 14, wherein said second protective element comprises a metal film.

16. The lithography system according to claim 15, wherein said metal film has a thickness of about 0.3–30 nm.

17. The lithography system according to claim 14, wherein said second protective element comprises a metal film.

18. The lithography system according to claim 17, wherein said metal film has a thickness of about 0.3–30 nm.

19. The lithography system according to claim 18, furthermore provided with means for providing a first electric potential (V1) to said converter plate, a second electric potential (V2) to said thin foil, and a third electric potential (V3) to said substrate, wherein the electric field between the converter plate and the foil is substantially larger than the electric field between the foil and the substrate.

20. The lithography system according to claim 1, furthermore provided with means for providing a first electric potential (V1) to said converter plate, a second electric potential (V2) to said thin foil, and a third electric potential (V3) to said substrate, wherein the electric filed between the converter plate and the foil is substantially larger than the electric field between the foil and the substrate.

21. The lithography system according to claim 1, wherein said foil is located closely above the substrate at a focal point of the electron beams.

22. The lithography system according to claim 1, wherein said foil stands free from said source of charged particles.

23. The lithography system of claim 1, wherein each electron beam is focused on the substrate to be processed with a spot smaller than 100 nm.

24. The lithography system of claim 23, further comprising means for scanning said electron beams and said substrate with respect to each other.

25. The lithography system of claim 1, wherein said holes are through holes.

26. The lithography system of claim 1, wherein said holes are perforations through said foil.

27. A method for transferring a pattern onto a resist on a substrate, using a lithography system comprising a converter element for receiving light and converting said light into a plurality of electron beams to be directed towards and focused on a substrate to be processed, said plurality of electron beams being used to define a pattern in a resist layer on said substrate, the method comprising the step of applying a metal film on said resist to protect, during transfer of said pattern, said converter element from contamination with material from the resist layer, said metal film being applied in an electron-transparent thickness.

28. The method of claim 27, wherein said metal film is applied with a thickness of between about 0.3–30 nm.

* * * * *